United States Patent

Turner et al.

[11] Patent Number: 5,512,320
[45] Date of Patent: Apr. 30, 1996

[54] VACUUM PROCESSING APPARATUS HAVING IMPROVED THROUGHPUT

[75] Inventors: Norman L. Turner, Mountain View; John M. White, Hayward, both of Calif.

[73] Assignee: Applied Materials, Inc., Santa Clara, Calif.

[21] Appl. No.: 227,480

[22] Filed: Apr. 13, 1994

Related U.S. Application Data

[63] Continuation of Ser. No. 10,684, Jan. 28, 1993, abandoned.

[51] Int. Cl.⁶ ..................................................... C23C 16/00
[52] U.S. Cl. ................ 427/255; 427/255.7; 427/255.5; 118/719; 118/725; 118/729; 432/5; 432/18; 432/86
[58] Field of Search ..................................... 118/719, 725, 118/729; 427/255, 255.7, 255.5; 432/5, 18, 86

[56] References Cited

U.S. PATENT DOCUMENTS

| | | | |
|---|---|---|---|
| 3,945,903 | 3/1976 | Svendoir et al. | 204/192 |
| 4,405,435 | 9/1983 | Tateishi et al. | 204/298 |
| 4,547,247 | 10/1985 | Warenback et al. | 156/345 |
| 4,592,306 | 6/1986 | Gallego | 118/719 |
| 4,719,921 | 12/1987 | Maher et al. | 156/345 |
| 4,951,601 | 8/1990 | Maydan et al. | 118/719 |
| 5,076,205 | 12/1991 | Vowles et al. | 118/719 |
| 5,259,881 | 11/1993 | Edwards | 118/719 |

FOREIGN PATENT DOCUMENTS

| | | |
|---|---|---|
| 525202 | 5/1993 | European Pat. Off. . |
| 1446199 | 12/1968 | Germany . |
| 869397 | 5/1952 | United Kingdom . |

OTHER PUBLICATIONS

Joint Development Agreement Between Applied Materials, Inc. (Applicant's Assignee) and two unrelated companies (Companies A & B), dated May 29, 1991 (Exhibit A hereto).

Primary Examiner—Richard Bueker
Attorney, Agent, or Firm—Birgit E. Morris; Lawrence Edelman

[57] ABSTRACT

A method for depositing sequential thin films on glass substrates by single substrate deposition comprising loading a batch of substrates into a load lock chamber and evacuating the chamber, transferring the substrates to a batch heating chamber for heating the substrates to elevated temperatures; transferring the glass substrates singly to one or more single substrate processing chambers, and sequentially transferring the substrates back to the load lock chamber where they are batch cooled.

A vacuum system for carrying out the method includes a load lock/cooling chamber for evacuating a plurality of glass substrates; a heating chamber for heating a plurality of substrates to elevated temperatures; one or more single substrate processing chambers; and a transfer chamber having access to all of said chambers and having automated means therein for transferring the glass substrates into and out of said chambers in a preselected order.

18 Claims, 1 Drawing Sheet

VACUUM PROCESSING APPARATUS HAVING IMPROVED THROUGHPUT

This is a continuation of U.S. application Ser. No. 08/010,684 filed Jan. 28, 1993 now abandoned.

This invention relates to a vacuum system for deposition of multiple thin films in single substrate processing chambers. More particularly, this invention relates to a vacuum system that combines single substrate processing chambers with batch heating and cooling chambers.

BACKGROUND OF THE INVENTION

Liquid crystal cells for active matrix TV and computer monitors are made of two glass plates sandwiching a layer of liquid crystal material between them. The glass plates are made conductive with a thin conductive film on the inside faces of the plates so that a source of power may be connected to them for changing the orientation of the liquid crystal molecules. As the need for larger and more sophisticated cells that allow separate addressing of different areas of the liquid crystal cell has progressed, as for active matrix TV where up to 1,000,000 or more different areas or pixels need to be separately addressed, the use of thin film transistors for this application has come into widespread use. Thin film transistors comprise a patterned metal gate over which is deposited a gate dielectric layer and a conductive layer, such as amorphous silicon. Subsequently applied layers, as of doped amorphous silicon, etch stopper silicon nitride, silicon oxide, metal contact layers and the like, are also required to be deposited over the amorphous silicon thin film. Many of these films are deposited by CVD in order to obtain high quality films.

In the semiconductor industry, as substrates such as silicon wafers have become larger, permitting a greater number of devices to be formed on a wafer, single substrate processing has largely replaced batch type processing of several wafers at a time. Single substrate processing allows greater control of the process, permits smaller vacuum chambers to be used and, if a problem arises during processing, only a single wafer, rather than a whole batch of wafers, is damaged or lost.

To improve the productivity of a single substrate vacuum processing system, including evacuating and re-pressurizing the processing chamber after each substrate has been processed, vacuum equipment has been designed that includes more than one processing chamber and a transfer chamber, so that multiple step processes can be performed in different chambers on a single substrate without removing the substrate from a vacuum environment. Such a system also has the concomitant advantage of a cleaner system. For example, Maydan et al have disclosed such a system in U.S. Pat. No. 4,951,601, which comprises a central transfer chamber surrounded by and connected to various processing chambers. A robot in the transfer chamber transfers the substrates from one chamber to another. The elimination of the need for evacuating the chambers prior to each processing step by the addition of a vacuum load lock also increases the throughput of the equipment.

Glass is a brittle dielectric material that requires slow heating and cooling, e.g., about 5 minutes or more, to avoid cracking or stressing of large glass plates over the temperature range of from room temperature up to about 300°–450° C., typically used for vacuum processing. Since the actual thin film deposition requires only seconds, without special provisions being made, a lot of idle time in the vacuum system would occur while the substrates are being individually heated and cooled. This waiting time would be very costly in terms of lost reactor time, and thus deposition of films in single substrate chambers would not be economical.

The deposition of multiple layer films on single glass substrates in a single vacuum system has been disclosed for example by Gallego, U.S. Pat. No. 4,592,306. The vacuum system disclosed by Gallego includes four or more deposition chambers connected to a central transfer chamber, a loading chamber and an exit chamber. Substrates are loaded into the system in the loading chamber which is evacuated, and the substrate is transferred by means of a robot in the central transfer chamber successively to two or more deposition chambers where various layers are deposited. The exit chamber can double as a metal deposition chamber. The sequential thin films are deposited onto the substrates which are loaded in the deposition chambers one at a time. The system was designed for sequentially depositing intrinsic and doped amorphous silicon layers for the manufacture of solar cells. Deposition is by glow discharge of silane and suitable dopant gases.

This system, while effective to deposit sequential layers on large glass substrates in a single vacuum system without breaking vacuum, is uneconomic because of the long period of time required to process each substrate and it does not provide heating and cooling of substrate materials. Gallego addresses part of this problem by providing two chambers for the deposition of intrinsic amorphous silicon, which layer is thicker and thus requires a longer deposition time than the thinner, doped amorphous silicon layers. However, Gallego did not address ways of reducing the overall deposition time or how to bring the temperature of the substrates to the reaction temperature, (270° C.) nor the time required to cool the substrates back to ambient temperatures prior to removing the substrate from the vacuum system.

Thin film transistors cannot be made using glow discharge techniques since amorphous silicon films made by glow discharge of silane have a high hydrogen content, which makes for unstable films and thus unstable transistor devices. Since CVD processes require higher temperatures than glow discharge deposition, on the order of 350°–450° C., and the glass substrates useful for active matrix TV monitors typically are quite large, e.g., 350×450×1 mm, it requires several minutes to heat the substrates up to processing temperatures and cool them down to ambient temperatures again after film processing is completed. This heating and cooling delay would be very costly in terms of lost reactor times. Thus deposition in several chambers would not result in efficient operation without waiting, unless the long heating and cooling times are addressed.

Thus a vacuum system having improved throughput that can process large glass substrates in a series of single substrate processing chambers and that solves the heating and cooling delay time would be highly desirable.

SUMMARY OF THE INVENTION

The vacuum system of the invention combines batch processing for heating and cooling a plurality of glass substrates with single substrate chamber processing. The vacuum system of the invention comprises a plurality of single substrate processing chambers and batch-type heating and cooling chambers connected to a central transfer chamber which can transfer the substrates among the various chambers in any preselected order.

The combined batch heating and cooling chambers and single substrate processing chambers provides a continuous and rapid flow of substrate processing while allowing adequate time for heating and cooling of glass substrates. Thus the apparatus of the invention provides an economic and advantageous way of processing to form a plurality of high quality thin films onto glass substrates in an efficient and economic manner.

DETAILED DESCRIPTION OF THE INVENTION

Figure 1:
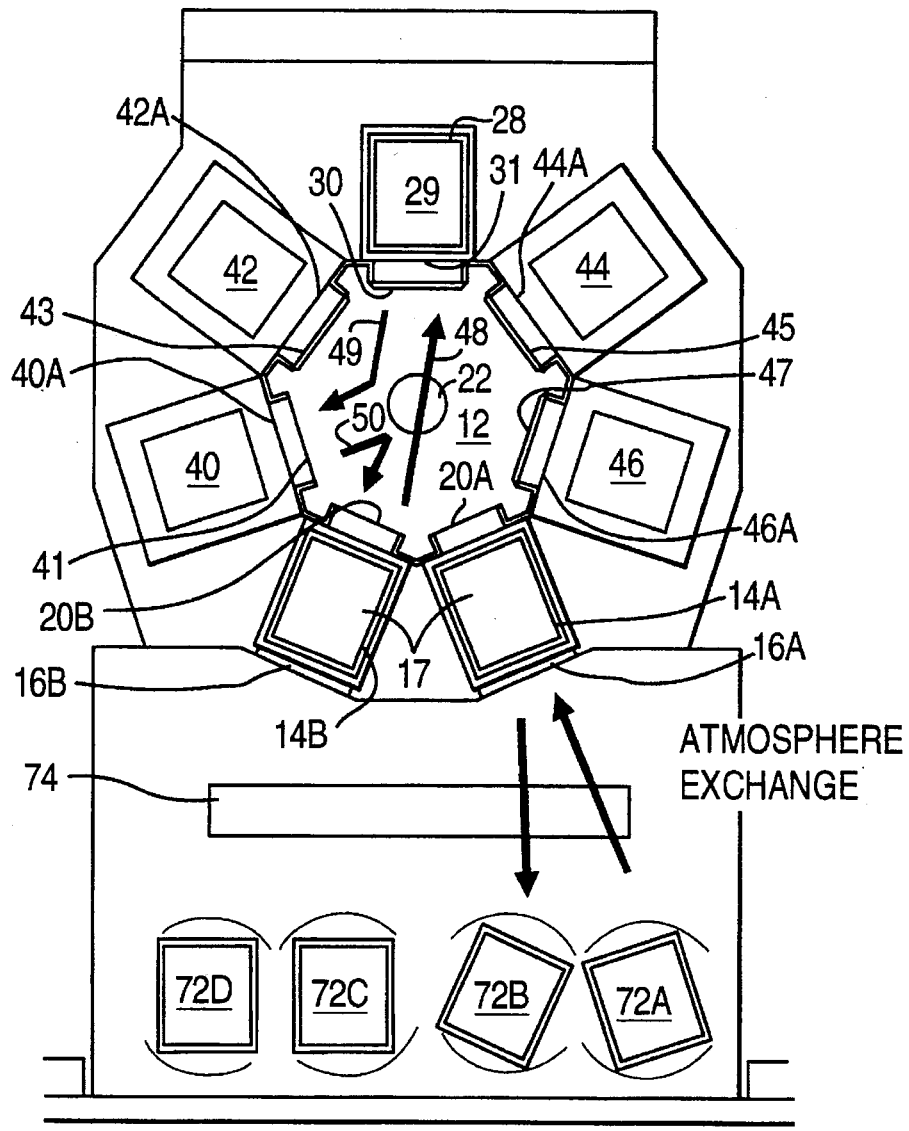
FIG. 1 is a plan view of the vacuum system of the invention for depositing thin films onto glass substrates.

A vacuum system 10 for processing large glass substrates in accordance with the invention is shown in FIG. 1. The vacuum system 10, referring now to FIG. 1, comprises a central transfer chamber 12 to which are connected two load lock/cooling chambers 14A and 14B, each for transferring the glass substrates to be processed into the system 10. The load lock/cooling chambers 14A and 14B have a closable opening comprising a load door 16A and 16B respectively on its outside wall for transfer of glass substrates to be processed into the vacuum system 10 from the atmosphere.

The load lock/cooling chambers 14A and 14B each contain a cassette 17 fitted with a plurality of shelves or platforms for supporting and cooling the large glass substrates. Heat is removed from the glass substrate in vacuum by radiation and gas conduction from the glass substrate to the support shelves above and below the glass substrate. The rate of heating or cooling glass substrates is determined by the emissivity of the shelf material, the emissivity of the glass and the vacuum pressure of the chamber. The heat transport Stefan-Boltzmann equation for two parallel planes is given in equation 1) below:

$$E_r = \frac{\sigma \epsilon_1 \epsilon_2}{\epsilon_1 + \epsilon_2 - \epsilon_1 \epsilon_2} (T_1^4 - T_2^4) \qquad 1)$$

where $E_r$ is the amount of energy transported in Watts/cm$^2$;

$T_1$ is the temperature of the shelves in K.°;

$T_2$ is the temperature of the glass in K.°;

$\epsilon_1$ is the emissivity of the shelves;

$\epsilon_2$ is the emissivity of the glass; and $\sigma$ is the Stefan-Boltzmann constant and heat transfer by gas conduction is proportional to gas pressure and is given by equation 2) below:

$$E_c = \frac{\Lambda(T_1 - T_2)\beta}{d + 2\beta c} \cdot P \qquad 2)$$

where $E_c$ is the heating energy in Watts/cm$^2$;

$\Lambda$ is the mean conductivity in K.°;

d is the gap between planes in cm;

$\beta$ is the gas accommodation coefficient;

c is the gas mean free path in microns;

P is the pressure in millitorr; and $T_1$ and $T_2$ have the meanings given above for equation 1) Heat put into the shelf can then be removed by conduction to a cooling heat transfer medium such as water.

The cassettes 17 in the load lock/cooling chambers 14 are mounted on an elevator assembly (not shown) to raise and lower the cassettes 17 incrementally the height of one shelf. To load chamber 14A, the load door 16A is opened and one glass substrate is placed on a shelf in the cassette 17. The elevator assembly raises the cassette 17 by the height of one shelf so that an empty shelf is opposite the load door 16A. Another substrate is placed on that shelf and so forth until all of the shelves of the cassette 17 are filled. At that point the load door 16A is closed and the chamber 14A is evacuated to the desired pressure in the vacuum system 10.

A slit valve 20A on the inside wall of the load lock/ cooling chamber 14A adjacent to the transfer chamber 12 is then opened. The glass substrates are transferred by means of a robot 22 in the transfer chamber 12 to a heating chamber 28.

The robot 22 is controlled by a microprocessor control system, display screen and keyboard (not shown), collectively designed to operate the robot 22 to support a glass substrate; as to withdraw a substrate from the cassette 17 of the load lock/cooling chamber 14A, rotate to present the substrate to an empty shelf of a cassette 29 in the heating chamber 28, insert the substrate onto an empty shelf in the heating chamber cassette 29 and withdraw, leaving the substrate on a shelf within the heating chamber cassette 29. The heating chamber cassette 29 is also mounted on an elevator assembly and after loading one shelf, the heating chamber cassette 29 is raised or lowered to present another empty shelf for access by the robot 22. The robot 22 then rotates again to retrieve another substrate from the cassette 17 of the load lock/cooling chamber 14A. In like manner the robot 22 can transfer all or a portion of the substrates from the heating chamber cassette 29 to a like slit valve in each of four single substrate processing chambers 40, 42, 44 and 46 in a preselected manner. Adequate time for the glass to reach processing temperature is provided while the substrates are waiting for film processing.

The heating chamber cassette 29 is comprised of a plurality of shelves or platforms which will be further described hereinbelow, together with a means of heating the shelves and is also mounted on an elevator assembly. The heating chamber cassette 29 is loaded with glass substrates one at a time in vacuum. The glass substrates are then heated to the desired deposition temperature in the heating chamber cassette 29 while they are awaiting processing.

After the last glass substrate is loaded into the heat cassette 29, the first glass substrate has reached processing temperature. After a heated glass substrate is transferred by means of the robot 22 to one of the single substrate processing chambers 40, 42, 44 and 46, it is always replaced with a cold one to be heated. The processing chambers 40, 42, 44 and 46 are adapted to deposit one or more thin layers onto the glass substrates. Each of the film chambers 40, 42, 44 and 46 are also fitted on their inner walls 40a, 42a, 44a and 46a respectively with a slit valve 41, 43, 45 and 47 respectively for isolation of the process gases. More than one process chamber can be operational at the same time.

More than one coating can be deposited in one of the chambers, as by feeding appropriate precursor gases to the chamber until the desired thickness of the thin film is reached, purging the chamber and feeding a second set of precursor gases to the chamber. Alternatively, the glass substrates can be transferred from one process chamber to another, in any preselected order, for deposition of a different thin film in each chamber. The timing and transfer of the glass substrates among the various chambers by the robot 22 is preselected under control of the microprocessor to deposit the desired number and thickness of films in the various chambers so as to keep the idle time within any one chamber at a minimum.

Although the above system is described using a plurality of film deposition chambers, other single substrate processing chambers can be included or substituted, including etch chambers, physical vapor deposition chambers, preclean chambers and the like.

At the end of film processing, each hot glass substrate is transferred back to the cooling cassette 17 of the load lock/cooling chamber 14A, one glass substrate being placed onto each shelf, and the elevator mechanism raising and lowering the cassette 17 to present an empty shelf to the transfer robot 22 for each substrate. The cooling cassette 17, having been refilled with new glass substrates is exchanging cold glass substrates for hot glass substrates. After completion of the loading exchange for the entire batch of glass substrates, the first substrate is already cool. After venting the load lock and cooling cassette 17, the last substrate is also cooled.

The arrows 48, 49 and 50 respectively show the direction of transfer for one possible sequence; arrow 48 shows the direction of transfer from the load lock/cooling chamber 14B to the heating chamber 28; arrow 49 shows the direction of transfer of a substrate from the heating chamber 28 to a CVD chamber 40; and the arrow 50 shows the direction of transfer of a substrate from the CVD chamber 40 back to the load lock/cooling chamber 14B until the load lock is fully exchanged; then when the chamber 14B is venting to atmosphere, load lock chamber 14A is available to the vacuum robot so that continuous processing is provided.

Figure 2:
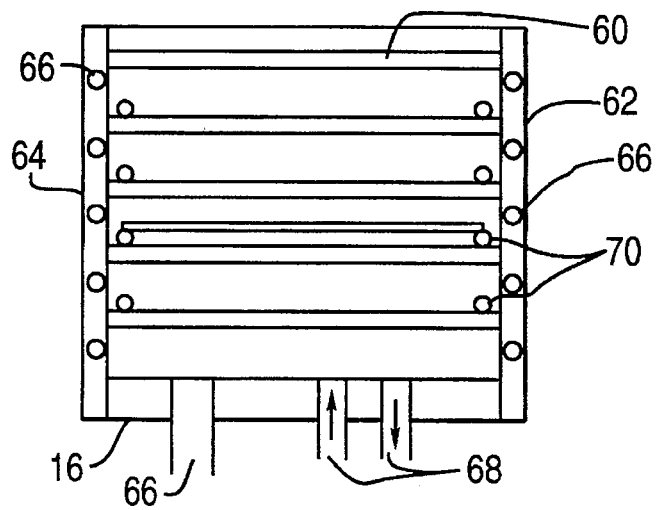
FIG. 2 is a cross sectional view of a batch-type heating or cooling chamber useful herein.

Details of the heating and cooling chamber cassettes 15 and 27 are shown in FIG. 2, which is a cross sectional view of a cooling chamber cassette 17.

The shelves 60 in both the heating chamber cassette 29 and the load lock/cooling chambers cassettes 17 are made of a heat conductive material, such as stainless steel clad copper, nickel coated stainless steel and the like. The side walls 62, 64 of the cassettes 17 and 29 are also made of a heat conductive metal, such as aluminum or copper. A channel 66 in the sidewalls 62, 64 of the cassette 29 contain a resistive heater connected to a source of power. A channel 68 in the sidewalls of the cooling chamber cassettes 17 permit the circulation of a coolant, such as water or other liquid, built into the sidewalls 62, 64 of these chambers. The glass substrates are situate on a plurality of dielectric mounts 70 which are situate or affixed onto the shelves 60 so that there is a gap between the substrates and the shelves 60. The glass substrates are thus radiantly heated or cooled uniformly from both sides, which provides for rapid and uniform heating or cooling and prevents cracking or warping of the substrates, even when heating or cooling over a temperature range of about 400° C.

After the substrates have been placed in the cooled cassette 17, cooling starts and after the loading time and chamber venting time has elapsed, the glass substrates are cool and the substrates can be removed from the vacuum system 10 through the load door 16A in the outer wall and stacked onto suitable storage cassettes 72.

The glass substrates can be loaded into the vacuum system 10 manually or in automated fashion. As shown in FIG. 1, a commercially available robot 74 mounted on a rail frame outside the vacuum system 10 at a first station opposite the load lock chamber 14A can retrieve a glass substrate from an empty storage cassette 72A, and load the glass substrates one at a time into the vacuum system 10 via the load lock/cooling chamber 14A. When the chamber 14A is filled and closed, the robot 74 can slide along the rail to a second station opposite the load lock chamber 14B and proceed to fill the second load lock/cooling chamber 14B, as from the cassette 72C. At the end of processing of the first load of substrates, the robot 74 can retrieve the processed substrates from the load lock chamber 14A and place the now coated substrates into an empty cassette 72B.

While the first batch of substrates are being processed and reloaded into a cassette in the first load lock/cool chamber 14A, a second batch of substrates can be loaded and brought down to vacuum in a cassette in the second, like load lock/cooling chamber 14B. Thus while the first batch of substrates is being cooled and removed from the vacuum system 10, a second batch of substrates has been brought to vacuum, heated and is now available for processing among the CVD chambers 40, 42, 44 and 46. The presence of two load lock chambers ensures a continuous processing of substrates in the vacuum system 10.

For the manufacture of thin film transistors onto large glass substrates, the average time for loading a glass substrate into and unloading it out of a load lock/cooling chamber is about 15 seconds for each operation; whereas the average time for heating a glass substrate to film deposition temperature is about 300 seconds. By having a batch of preheated glass substrates waiting their turn for processing or venting back to atmosphere, the long average heating time for a substrate is hidden in the waiting time for processing or venting respectively.

Thus the system 10 provides continuous and rapid processing of substrates by performing the lengthy heating and cooling steps in a batch-type chamber; and it provides for processing substrates in the processing chambers one at a time, thus retaining all the advantages of such single substrate processing. Further, combining a load lock function and a cooling function in a single cooling/load lock chamber eliminates the need for an additional cooling chamber and an additional transfer of the substrates, which further adds to the efficiency of the present vacuum system.

Although the present vacuum system has been illustrated using certain embodiments and sequences, various changes can be made to the equipment without departing from the essence of the invention. For example, various numbers of processing, heating and cooling chambers or combined heating and cooling chambers can be employed providing they are accessible to the central transfer chamber; various sequences of heating, deposition and cooling can be carried out depending upon the thin films and sequences of deposition desired; and additional processing chambers can be added or substituted in the system, such as physical vapor deposition or etch chambers, preclean chambers and the like. Such variations and changes will be apparent to one skilled in the art, and the invention is only meant to be limited by the appended claims.

We claim:

1. A vacuum system for single substrate film processing onto glass substrates comprising:

one or more load lock/cooling chambers having a plurality of shelves for supporting and cooling a plurality of glass substrates therein;

a heating chamber for heating a plurality of glass substrates to elevated temperatures;

one or more single substrate processing chambers for deposition of thin films onto said glass substrates, and a transfer chamber having access to all of said chambers and having automated means of transferring glass substrates to any of said chambers.

2. A vacuum system according to claim 1 wherein said load lock/cooling and heating chambers contain cassettes that are mounted on an elevator assembly.

3. A vacuum system according to claim 1 wherein two load lock/cooling chambers are present.

4. A vacuum system according to claim 1 wherein at least two processing chambers are present.

5. A vacuum system according to claim 1 wherein said single substrate processing chambers are chemical vapor deposition chambers.

6. A method for depositing thin films onto a glass substrate which comprises the steps in sequence:
   a) loading a plurality of glass substrates into a load lock/cooling chamber and evacuating said chamber;
   b) transferring all of said glass substrates through a connecting vacuum transfer chamber to a chamber adapted for heating said substrates to elevated temperatures;
   c) transferring one of the heated substrates from step b) through the transfer chamber to a single substrate processing chamber and depositing a thin film thereon; and
   d) transferring a substrate from step c) back to the load lock/cooling chamber of step a) and cooling the substrate.

7. A method according to claim 6 wherein subsequent to step c) the step of transferring the substrate to one or more additional processing chambers for depositing additional thin films thereon.

8. A method for processing films on a glass substrate which comprises the steps in sequence:
   a) loading a plurality of glass substrates into a load lock/cooling chamber and evacuating said chamber;
   b) transferring all of said glass substrates through a connecting vacuum transfer chamber to a chamber adapted for heating said substrates to elevated temperatures for processing;
   c) transferring one of the heated substrates from step b) through the transfer chamber to a single substrate processing chamber for processing; and
   d) transferring a processed substrate from step c) back to the load lock/cooling chamber of step a) and cooling the substrate.

9. A method according to claim 6 wherein said chamber adapted for heating can accommodate a plurality of substrates.

10. A method according to claim 6 wherein, after step c) transfers one of said heated substrates from said chamber adapted for heating, said step b) transfers one of said substrates from said load lock/cooling chamber to said chamber adapted for heating, whereby a heated substrate removed from said chamber adapted for heating is replaced by a cold substrate.

11. A method for processing substrates in a multi-chamber vacuum system comprising a heating chamber accommodating a plurality of substrates, a processing chamber, and a transfer chamber communicating with both said heating chamber and said processing chamber, said method comprising the steps of:
   a) a first step of transferring a first substrate within said multi-chamber vacuum system into said heating chamber;
   b) heating a plurality of substrates within said heating chamber including said first substrate;
   c) a second step of transferring said heated first substrate from said heating chamber to said processing chamber to process said first substrate therein at an elevated temperature, said first and second transferring steps leaving a plurality of said substrates resident in said heating chamber at a same time; and
   d) a third step of transferring said processed first substrate out of said processing chamber.

12. A method according to claim 11 wherein said multi-chamber vacuum system includes at least one load lock chamber, said method further comprising:
   a) loading a plurality of substrates from outside the multi-chamber vacuum system into a first one of said at least one load lock chamber; and
   b) evacuating said first load lock chamber; wherein said first transferring step transfers said first substrate from said first load lock chamber.

13. A method according to claim 12 wherein said multi=chamber vacuum system includes two load lock chambers and wherein said third transferring step transfers said processed first substrate to a second one of said two load lock chamber.

14. A method according to claim 11 wherein said first transferring step transfers a single substrate and said first and second transferring steps are alternately executed.

15. A method according to claim 11 wherein said first substrate is a glass substrate;
   wherein said processing step comprises chemical vapor deposition; and
   wherein said heating step heats said first substrate to a temperature in the range of 350°–450° C.

16. A vacuum processing system comprising:
   a) an evacuable transfer chamber;
   b) a heating chamber in communication with said transfer chamber and accommodating a plurality of substrates for heating said substrates therein to an elevated temperature;
   c) at least one evacuable single-wafer processing chamber selectively in communication with said transfer chamber;
   d) at least one evacuable load lock chamber selectively in communication with said transfer chamber for transfer of said substrates into and out of said vacuum processing system; and
   e) a robot principally disposed in said transfer chamber for transferring said substrates between said load lock chamber, said heating chamber and said processing chamber.

17. A vacuum processing system according to claim 16 wherein said heating chamber comprises a vertically movable set of shelves, each shelf accommodating one of said substrates.

18. A system according to claim 16 wherein said chambers and said robot are sized to accommodate substrates useful as rectangular displays.

* * * * *